(12) United States Patent
Kawahara

(10) Patent No.: US 8,138,521 B2
(45) Date of Patent: Mar. 20, 2012

(54) THYRISTOR SEMICONDUCTOR DEVICE AND SWITCHING METHOD THEREOF

(75) Inventor: Hideaki Kawahara, Tokyo (JP)

(73) Assignee: Texas Instruments Incorporated, Dallas, TX (US)

( * ) Notice: Subject to any disclaimer, the term of this patent is extended or adjusted under 35 U.S.C. 154(b) by 710 days.

(21) Appl. No.: 11/862,285

(22) Filed: Sep. 27, 2007

(65) Prior Publication Data

US 2008/0105895 A1 May 8, 2008

(30) Foreign Application Priority Data

Nov. 7, 2006 (JP) ................................. 2006-301497

(51) Int. Cl.
*H01L 29/74* (2006.01)
(52) U.S. Cl. ........ 257/109; 257/107; 257/113; 257/133; 257/144; 257/163; 257/164
(58) Field of Classification Search .................. 257/109, 257/144, 133, 113, 164
See application file for complete search history.

(56) References Cited

U.S. PATENT DOCUMENTS

| | | | |
|---|---|---|---|
| 6,765,771 B2* | 7/2004 | Ker et al. .................... | 361/56 |
| 6,921,931 B2* | 7/2005 | Higashi et al. ............. | 257/173 |
| 7,157,342 B1* | 1/2007 | Tarabbia et al. ........... | 438/303 |
| 7,285,828 B2* | 10/2007 | Salcedo et al. ............ | 257/357 |
| 7,476,593 B2* | 1/2009 | Zhu et al. ................... | 438/328 |

* cited by examiner

*Primary Examiner* — Samuel Gebremariam
(74) *Attorney, Agent, or Firm* — Warren L. Franz; Wade J. Brady, III; Frederick J. Telecky, Jr

(57) ABSTRACT

The objective of this invention is to provide a semiconductor device having a thyristor that can shorten the turn-off time. A first electroconductive type first semiconductor region 20 is formed on a substrate, and a second electroconductive type second semiconductor region 22, a second electroconductive type third semiconductor region 23, designated as an anode, and a first electroconductive type fourth semiconductor region 24, designated as an anode gate, are formed on the surface layer part of the first semiconductor region. Also, a first electroconductive type fifth semiconductor region 26, designated as a cathode, and a second electroconductive type sixth semiconductor region 25, designated as a cathode gate, are formed on the surface layer part of the second semiconductor region. A gate insulating film 30 and a gate electrode 31 are formed in an upper layer of the second semiconductor region in a region from a boundary of the first semiconductor region and the second semiconductor region to a boundary of the second semiconductor region and the fifth semiconductor region, and an electroconductive layer for input and output is formed in the third semiconductor region, fourth semiconductor region, sixth semiconductor region, and fifth semiconductor region. A thyristor is constituted by the third semiconductor region, the first semiconductor region, the second semiconductor region, and the fifth semiconductor region.

20 Claims, 13 Drawing Sheets

THYRISTOR SEMICONDUCTOR DEVICE AND SWITCHING METHOD THEREOF

FIELD OF THE INVENTION

The present invention pertains to the field of semiconductor devices. In particular, the present invention pertains to thyristor semiconductor devices.

BACKGROUND OF THE INVENTION

A thyristor is a semiconductor device that has a pnpn structure and carries out a switching operation, and in particular, it has an important function as a high power control device.

FIG. 14 depicts a cross section of a thyristor semiconductor device fabricated per the current art.

A first n-type semiconductor region 101 (N1) is formed on a p-type semiconductor substrate 100, and an electrically insulating layer 102 is formed on regions of a top surface of the first n-type semiconductor region 101.

A second n-type semiconductor region 103 (N2) and a first p-type semiconductor region 104 (P1) are formed at prescribed depths in prescribed regions of the first n-type semiconductor region 101.

A second p-type semiconductor region 105, denoted as an anode AN, is formed on a region of a top surface of the second n-type semiconductor region 103.

A third p-type semiconductor region 107, denoted as a gate G, and a third n-type semiconductor region 108, denoted as a cathode CA, are formed in regions on a top surface of the first p-type semiconductor region 104. Gate G and cathode CA are separated by regions of electrically insulating layer 102.

A first interlayer electrically insulating layer 110, typically composed of silicon dioxide, is formed on a top surface of electrically insulating layer 102, second p-type semiconductor region 105, third p-type semiconductor region 107 and third n-type semiconductor region 108.

Contact holes, denoted CT1, are formed through first interlayer electrically insulating layer 110, reaching second p-type semiconductor region 105, third p-type semiconductor region 107, and third n-type semiconductor region 108. Contact holes CT1 are filled with a first electrically conducting layer, 111.

A second electrically conductive layer 112 is formed in regions on a top surface of first interlayer insulating film 110. Conductive layer 112 contacts conductive layer 111.

A second interlayer electrically insulating film 113, typically composed of silicon dioxide, is deposited over second electrically conductive layer 112 and first interlayer insulating film 110.

Contact holes, denoted CT2, are formed through second interlayer electrically insulating layer 113, reaching second electrically conductive layer 112. Contact holes CT2 are filled with a third electrically conducting material, 114.

A fourth electrically conductive layer 115 is formed in regions on a top surface of second interlayer insulating film 113. Conductive layer 115 contacts conductive layer 114.

In summary, the device depicted in FIG. 14 is a semiconductor with a pnpn structure, in which the first p-type element forms an anode, the second n-type element forms a cathode, and the second p-type element forms a gate; these elements in this configuration form a thyristor.

In this example, the thyristor is switched from high impedance, denoted OFF, to low impedance, denoted ON, by the injection of holes from the anode AN and the injection of electrons from the cathode CA by applying a current to the gate G. Similarly, the thyristor is switched from ON to OFF by turning off the current to the gate G. When the thyrsitor is switched from ON to OFF, time is required for extracting the holes injected into the first n-type semiconductor region 101, so that the turn-off time of the thyristor is lengthened beyond the cessation of current to the gate G. This is a disadvantage of the current art.

SUMMARY OF THE INVENTION

The objective of the present invention is to provide a semiconductor device having a thyristor, which can be operated in a manner to shorten the turn-off time and suppress current spikes during turn-on. An anode gate is added to a thyristor of the current art. The potential on the anode gate may be raised when the thyrsitor is switched off, causing the current in the thyristor to turn off more quickly than in a thyristor without an anode gate. Also, the elements of the thyristor may be isolated from adjacent circuit elements by insulating materials, which reduces the turn-off time. Furthermore, adding a secondary region under the anode reduces the turn-off time. Lastly, a MOS transistor shunt may be added from the base of the PNP transistor in the thyristor to the cathode of the thyristor to suppress current spikes during turn-on.

REFERENCE NUMERALS AND SYMBOLS AS SHOWN IN THE DRAWINGS

Figure 10:
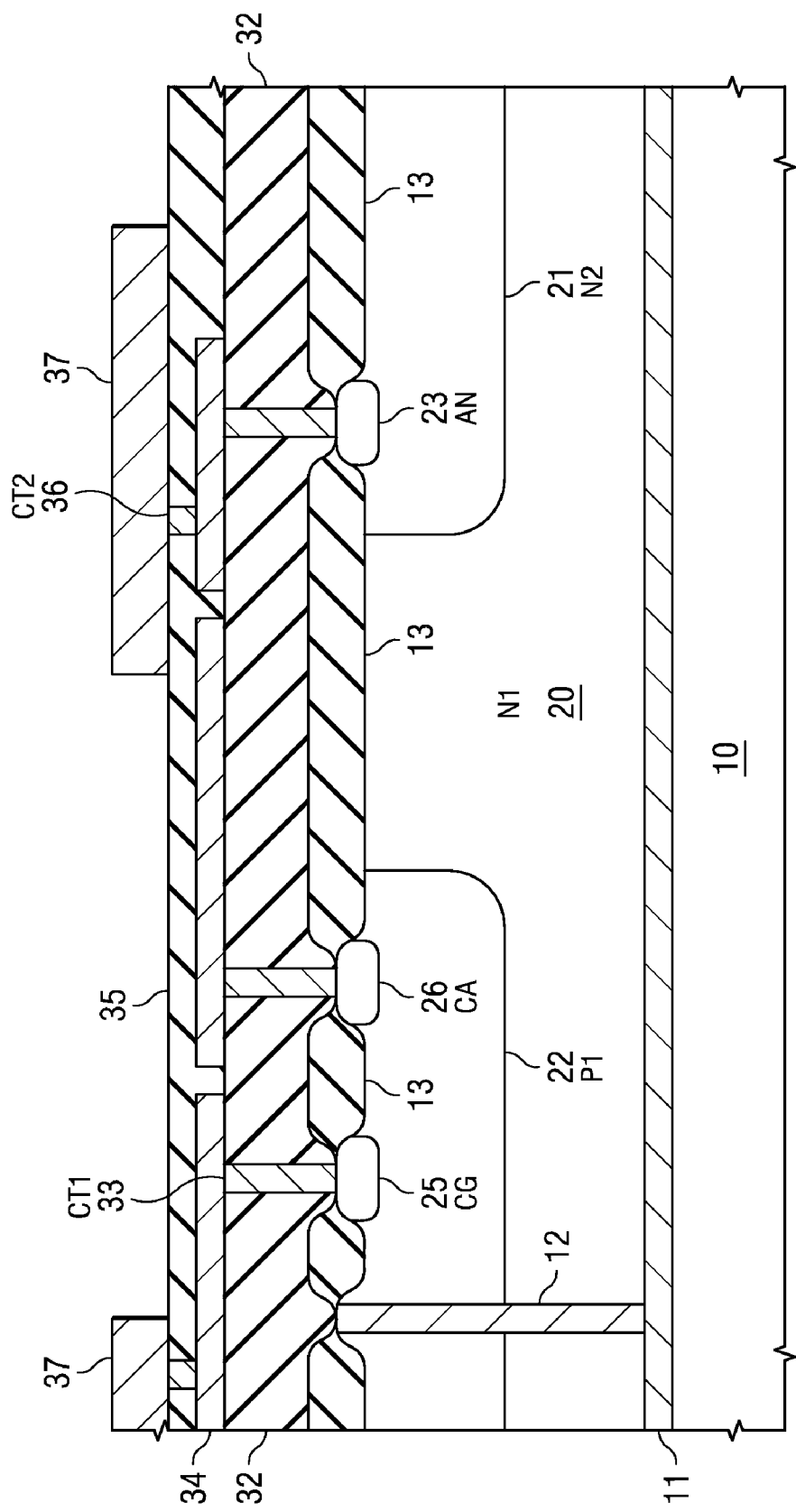
FIG. 10 is a cross section at 10-10 of FIG. 9.

In the FIG. 10 represents a p-type semiconductor substrate, 11 represents a Bottom insulating film, 12 represents a trench type element separating insulating film, 13 represents a LCCOS element separating insulating film, 20, N1 represents a first n-type semiconductor region, 21, N2 represents a second n-type semiconductor region, 22, P1 represents a first p-type semiconductor region, 23 represents a second p-type semiconductor region, 24 represents a third n-type semiconductor region, 25 represents a third p-type semiconductor region, 26 represents a fourth (third) n-type semiconductor region, 30 represents a gate insulating film, 31 represents a gate electrode, 32 represents a first interlayer insulating film, 33 represents a first electroconductive layer, 34 represents a second electroconductive layer, 35 represents a second interlayer insulating film, 36 represents a third electroconductive layer, 37 represents a fourth electroconductive layer CT1, CT2 represents a contact hole, AN represents an anode, AG represents an anode gate, CA represents a cathode, CG represents a cathode gate, MG represents a gate electrode.

DETAILED DESCRIPTION

In order to achieve the above mentioned objective, the semiconductor device of the present invention is characterized by the fact that in a semiconductor device comprising:

a. a first electroconductive type first semiconductor region formed on a substrate, b. a second electroconductive type second semiconductor region formed on a surface region of the first semiconductor region, c. a second electroconductive type third semiconductor region that is formed on a surface region of the first semiconductor region, different from the second semiconductor region, and is designated an anode, d. a first electroconductive type fourth semiconductor region that is formed on a surface region of the first semiconductor region, different from the second semiconductor region and the third semiconductor region, and is designated an anode gate, e. a first electroconductive type fifth semiconductor region that is formed on a surface region of the second semiconductor region and is designated a cathode, f. a second electroconductive type sixth semiconductor region that is formed on a surface region of the second semiconductor region, different from the fifth semiconductor region, and is designated a cathode gate, g. a gate insulating film and a gate electrode formed on an upper surface of the second semiconductor region in a region from a boundary of the first semiconductor region and the semiconductor region to a boundary of the second semiconductor region and the fifth semiconductor region, and h. an electrically conductive layer for input and output connected to each of the third semiconductor region, the fourth semiconductor region, the sixth semiconductor region, the fifth semiconductor region, and the gate electrode, a thyristor is formed by the third semiconductor region, the first semiconductor region, the second semiconductor region, and the fifth semiconductor region.

In a preferred embodiment of the present invention, the embodiment described above is enhanced by an electrically insulating layer formed at a boundary of said substrate and said first semiconductor region, and an isolation structure, such as trench isolation, formed to electrically isolate each said semiconductor region from other regions on said substrate.

Another embodiment of this invention is characterized by the fact that in a semiconductor device comprising:

a. a first electroconductive type first semiconductor region formed on a substrate, b. a second electroconductive type second semiconductor region formed on a surface region of the first semiconductor region, c. a second electroconductive type third semiconductor region that is formed on a surface region of the first semiconductor region, different from the second semiconductor region, and is designated an anode, d. a first electroconductive type fourth semiconductor region that is formed on a surface region of the first semiconductor region, different from the second semiconductor region and the third semiconductor region, and is designated an anode gate, e. a first electroconductive type fifth semiconductor region that is formed on a surface region of the second semiconductor region and is designated a cathode, f. a second electroconductive type sixth semiconductor region that is formed on a surface region of the second semiconductor region, different from the fifth semiconductor region, and is designated a cathode gate, and g. an electrically conductive layer for input and output connected to each of the third semiconductor region, the fourth semiconductor region, the sixth semiconductor region, and the fifth semiconductor region, a thyristor is formed by the third semiconductor region, the first semiconductor region, the second semiconductor region, and the fifth semiconductor region.

In another embodiment of this invention, the third embodiment described above is enhanced by an electrically insulating layer formed at a boundary of said substrate and said first semiconductor region, and an isolation structure, such as trench isolation, formed to electrically isolate each said semiconductor region from other regions on said substrate.

All the embodiments described above may be enhanced by adding a first electroconductive type seventh semiconductor region with an impurity concentration different from that of said first semiconductor region formed on a surface region of said first semiconductor region, wherein said third semiconductor region and said fourth semiconductor region are formed on a surface region of the seventh semiconductor region.

Another embodiment of this invention is characterized by the fact that in a semiconductor device comprising:

a. a first electroconductive type first semiconductor region formed on a substrate, b. a second electroconductive type second semiconductor region formed on a surface region of the first semiconductor region, c. a second electroconductive type third semiconductor region that is formed on a surface region of the first semiconductor region, different from the second semiconductor region, and is designated an anode, d. a first electroconductive type fourth semiconductor region that is formed on a surface region of the second semiconductor region and is designated a cathode, e. a second electroconductive type fifth semiconductor region that is formed on a surface region of the second semiconductor region, different from the fourth semiconductor region, and is designated a cathode gate, and f. an electrically conductive layer for input and output connected to each of the third semiconductor region, the fifth semiconductor region, and the fourth semiconductor region, a thyristor is formed by the third semiconductor region, the first semiconductor region, the second semiconductor region, and the fourth semiconductor region.

In another embodiment of this invention, the embodiment described immediately above is enhanced by an electrically insulating layer formed at a boundary of said substrate and said first semiconductor region, and an isolation structure, such as trench isolation, formed to electrically isolate each said semiconductor region from other regions on said substrate.

The two embodiments described immediately above may be enhanced by adding a gate insulating film and a gate electrode formed on an upper layer of said second semiconductor region in a region from a boundary of said first semiconductor region and said second semiconductor region to a boundary of said second semiconductor region and said fourth semiconductor region.

The embodiments described immediately above may be enhanced by adding a first electroconductive type sixth semiconductor region with an impurity concentration different from that of said first semiconductor region formed on a surface region of said first semiconductor region, and said third semiconductor region is formed on a surface region of said sixth semiconductor region.

In order to achieve the above-mentioned objective, a method for operating an embodiment of the present invention comprising:

a. a first electroconductive type first semiconductor region formed on a substrate, b. a second electroconductive type second semiconductor region formed on a surface region of the first semiconductor region, c. a second electroconductive type third semiconductor region that is formed on a surface region of the first semiconductor region, different from the second semiconductor region, and is designated an anode, d. a first electroconductive type fourth semiconductor region that is formed on a surface region of the first semiconductor region, different from the second semiconductor region and the third semiconductor region, and is designated an anode gate, e. a first electroconductive type fifth semiconductor region that is formed on a surface region of the second semiconductor region and is designated a cathode, f. a second electroconductive type sixth semiconductor region that is formed on a surface region of the second semiconductor region, different from the fifth semiconductor region, and is designated a cathode gate, and g. an electrically conductive layer for input and output connected to each of the third semiconductor region, the fourth semiconductor region, the sixth semiconductor region, and the fifth semiconductor region, wherein a thyristor is formed by the third semiconductor region, the first semiconductor region, the second semiconductor region, and the fifth semiconductor region, when the thyristor is switched from the ON state to the OFF state, is that the anode gate is switched to a potential that is higher than or the same as that of the anode, starting at or after a time that the cathode gate begins to be switched from the ON state to the OFF state, and attains said potential before the cathode gate attains the OFF state.

In the embodiments of the present invention described above, wherein said thyristor further has a gate insulating film and a gate electrode formed on an upper layer of said second semiconductor region in a region from a boundary of said first semiconductor region and said second semiconductor region to the boundary of said second semiconductor region and said cathode, a method for operating this invention is: when said thyristor is switched from the OFF state to the ON state, the ON state potential is applied to the gate electrode for a period including the timing for switching said cathode gate from the OFF state to the ON state. Applying the ON state potential to the gate electrode shunts the first semiconductor region to the second semiconductor region, so that a steep rise rate in current through the thyristor can be suppressed. This is advantageous, because steeply rising currents can cause Electro Magnetic Interference (EMI), which causes undesirable electrical and radiative noise).

In the embodiments of the present invention described above wherein an anode gate is included, the turn-off time of said thyristor can be shortened by controlling the anode gate potential as described above.

In the embodiments of the present invention described above wherein an electrically insulating layer is formed at a boundary of said substrate and said first semiconductor region, and an isolation structure, such as trench isolation, is formed to electrically isolate each said semiconductor region from other regions on said substrate, the turn-off time of said thyristor can be shortened by shortening the time required for extracting holes at turn-off time.

Next, embodiments of the semiconductor device of the present invention are explained referring to the Figures.

Figure 1:
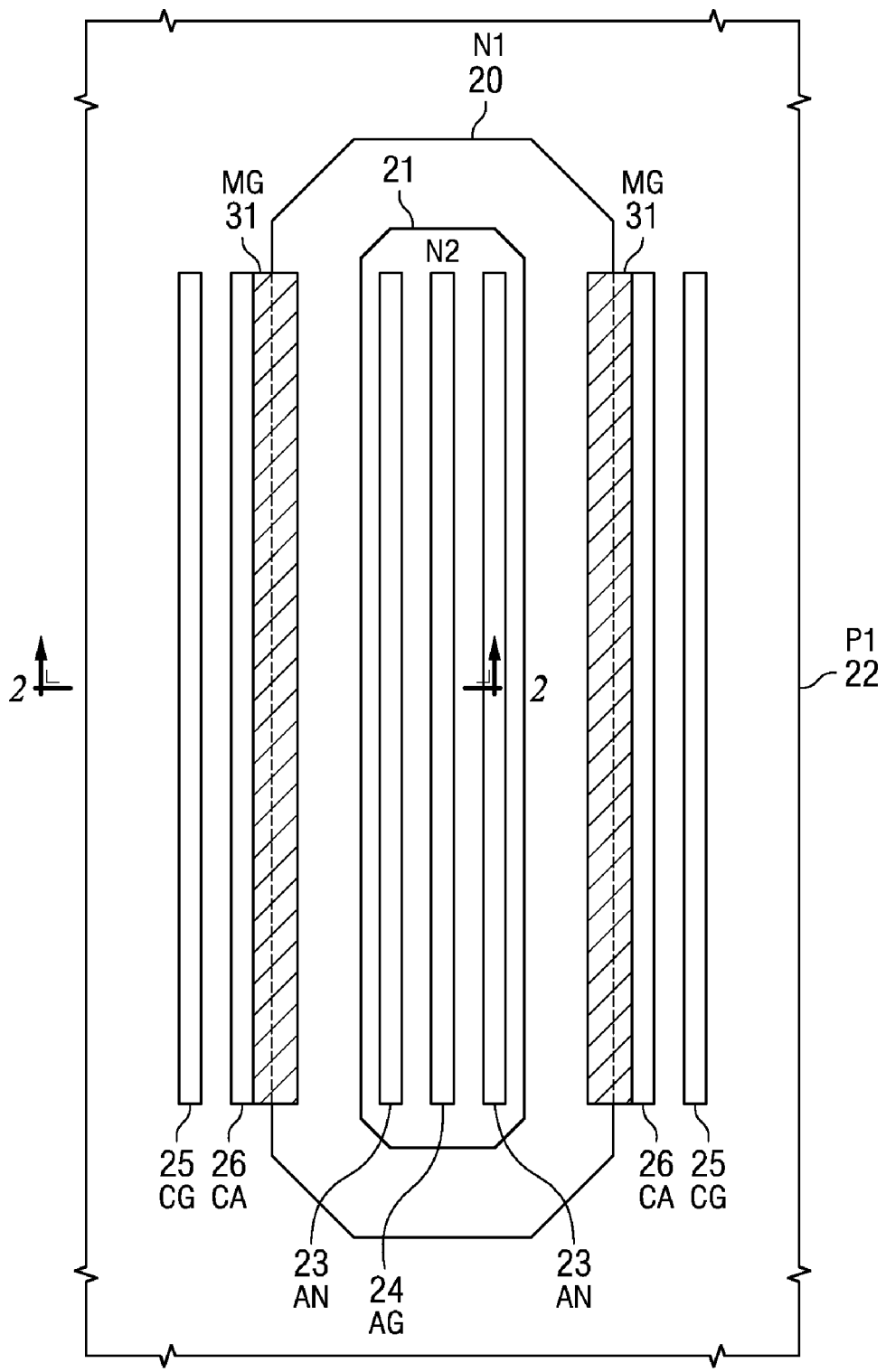
FIG. 1 is a plan view showing the semiconductor device having a thyristor of a first embodiment of the present invention.
Figure 2:
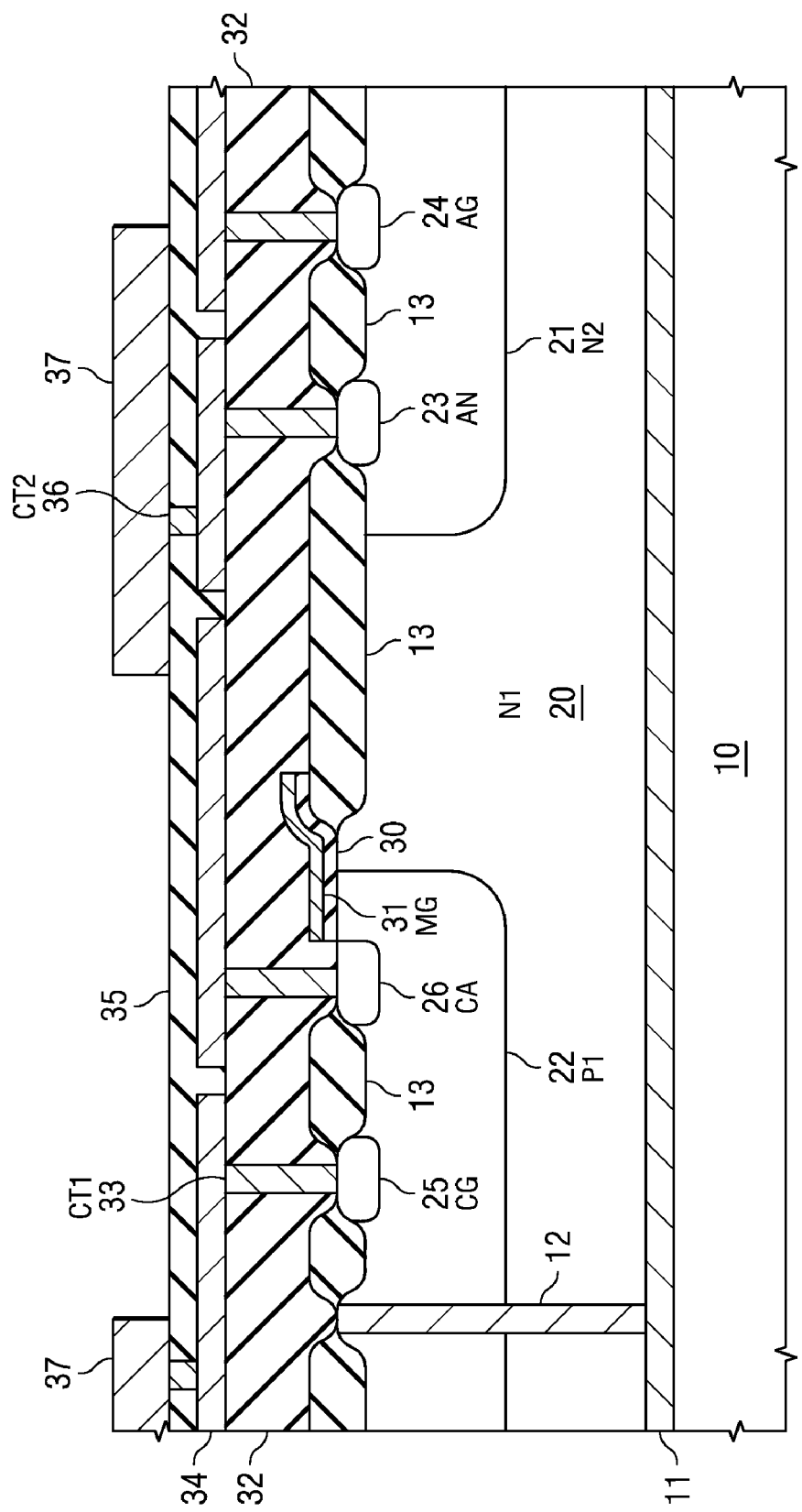
FIG. 2 is a cross section of 2-2 of FIG. 1.

FIG. 1 is a plan view showing a semiconductor device having a thyristor of this invention, and FIG. 2 is a cross section at 2-2 of FIG. 1. As shown in FIG. 1, each region such as an anode and a cathode is arranged in a left-right symmetrical shape in the plan view, and the architecture of one side thereof (left side) is shown in the cross section of FIG. 2.

In this example, a bottom insulating film 11, typically composed of silicon dioxide, is formed on a p-type semiconductor substrate 10, and a first n-type semiconductor region (first semiconductor region) 20 (N1), typically composed of silicon, is formed on an upper surface of the bottom insulating film 11, so that a so-called SOI (semiconductor on insulator) substrate is formed.

Continuing in this example, a trench type isolation structure 12 for separating components is formed through the first n-type semiconductor region 20 and an isolation layer 13, typically formed by local oxidation of silicon (LOCOS), is formed on a surface layer part of the first n-type semiconductor region 20, so that elements are separated. The isolation layer and structures (13, 12) are typically composed of silicon dioxide.

Continuing in this example, a second n-type semiconductor region (seventh semiconductor region) 21 (N2) with an impurity concentration different from that of the first n-type semiconductor region 20 is formed at a prescribed depth in a prescribed region in the first n-type semiconductor region 20 (FIG. 2 shows n-type well region 21 spaced above the lower surface of n-type semiconductor region 20), and a first p-type semiconductor region (second semiconductor region) 22 (P1) is formed in a region in the first n-type semiconductor region 20, different from the second n-type semiconductor region 21 (FIG. 2 shows p-type well region 22 spaced above the lower surface of n-type semiconductor region 20 at a position laterally spaced from the n-type well region 21 across a part of the n-type semiconductor region 20). An impurity concentration of the second n-type semiconductor region 21 is higher than an impurity concentration of the first n-type impurity region 20.

Continuing in this example, a second p-type semiconductor region (third semiconductor region) 23, designated as an anode AN (FIG. 2 shows first p-type contact region 23 formed at the upper surface in the n-type well region 21), and a third n-type semiconductor region (fourth semiconductor region) 24, designated as an anode gate AG (FIG. 2 shows first n-type contact region 24 formed at the upper surface in the n-type well region 21 at a position laterally spaced from the first p-type contact region 23 in a direction away from the p-type well region 22), are formed in regions separated by the isolating layer 13 in the surface region of the second n-type semiconductor region 21. An impurity concentration of the third n-type semiconductor region 24 is higher than the impurity region of the second n-type semiconductor region 21.

Continuing in this example, a third p-type semiconductor region (sixth semiconductor region) 25, designated as a cathode gate CG (FIG. 2 shows second p-type contact region 25 formed at the upper surface in the p-type well region 22), and a fourth n-type semiconductor region (fifth semiconductor region) 26, designated as a cathode CA (FIG. 2 shows second n-type contact region 26 formed at the upper surface in the p-type well region 22 at a position laterally spaced from the second p-type contact region 25 in a direction towards the n-type well region 21), are formed in regions separated by the isolating layer 13 in the surface region of the first p-type semiconductor region 22. An impurity concentration of the third p-type semiconductor region 25 is higher than an impurity region of the first p-type semiconductor region 22.

As mentioned above, a thyristor is formed comprising second p-type semiconductor region 23, first n-type semiconductor region 20 and second n-type semiconductor region 21, and first p-type semiconductor region 22 and fourth n-type semiconductor region 26.

Also, the third n-type semiconductor region 24 and the third p-type semiconductor region 25 are arranged by being connected respectively to the second n-type semiconductor region 21 and the first p-type semiconductor region 22.

Continuing in this example, a gate insulating film 30 and a gate electrode 31 (MG) are formed on an upper surface of first p-type semiconductor region 22 in a region at least from a boundary of the first n-type semiconductor region 20 and the first p-type semiconductor region 22 to a boundary of the first p-type semiconductor region 22 and the fourth n-type semiconductor region 26, so that a metal oxide semiconductor (MOS) transistor is formed.

Also, a first interlayer insulating film 32, typically composed of silicon dioxide, is formed on a surface of the second p-type semiconductor region 23, third n-type semiconductor region 24, third p-type semiconductor region 25, the fourth n-type semiconductor region 26, and the gate electrode 31. Contact holes CT1 are formed through first interlayer insulating film 32, reaching the second p-type semiconductor region 23, third n-type semiconductor region 24, third p-type semiconductor region 25, and fourth n-type semiconductor region 26. A first electrically conductive layer 33 is formed in contact holes CT1, and second electrically conductive layer 34 is formed on the first interlayer insulating film 32. Conductive layer 34 contacts conductive layer 33.

Furthermore, a second interlayer electrically insulating film 35, typically composed of silicon dioxide, is deposited over first interlayer insulating film 32 and second electrically conductive layer 34. Contact holes CT2 are formed through second interlayer electrically insulating film 35, reaching second conductive layer 34 A third electrically conductive layer 36 is formed in contact holes CT2, and a fourth electrically conductive layer 37 is formed on the second interlayer insulating film 35. Conductive layer 37 contacts conductive layer 36.

As mentioned above, an electrically conductive layer for input and output connected to each of the second p-type semiconductor region 23, third n-type semiconductor region 24, third p-type semiconductor region 25, and fourth n-type semiconductor region 26 is formed.

Figure 3:
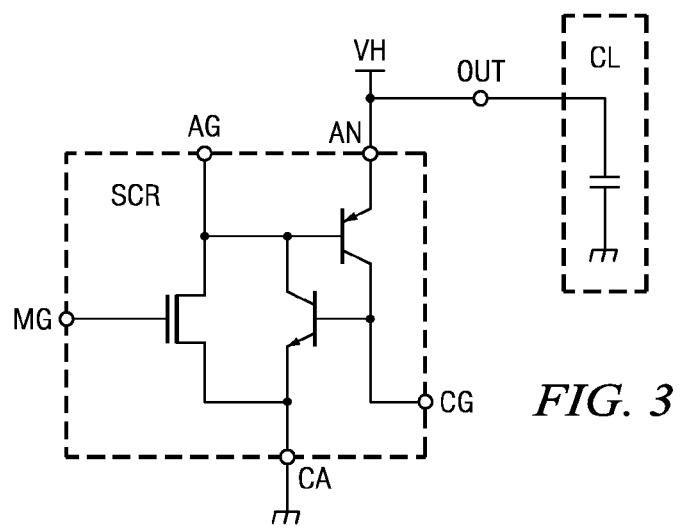
FIG. 3 is an equivalent circuit diagram showing the thyristor in the semiconductor device of the first embodiment of the present invention.

FIG. 3 is an equivalent circuit diagram showing a thyristor in a semiconductor device of this embodiment.

The thyristor, in this example, is comprised of two bipolar transistors, and in this embodiment, a MOS transistor is further comprised as shown in the Figure. Prescribed signals are input into the anode gate AG, cathode gate CG, and MOS gate electrode MG, and the cathode CA is grounded, and the anode AN is connected to a prescribed potential VH.

Electrical current from the anode AN is output through the output OUT of the circuit of the thyristor, also known as a Semiconductor Controlled Rectifier (SCR), for example, into a capacitive load, depicted in FIG. 3 as CL.

Figure 4:
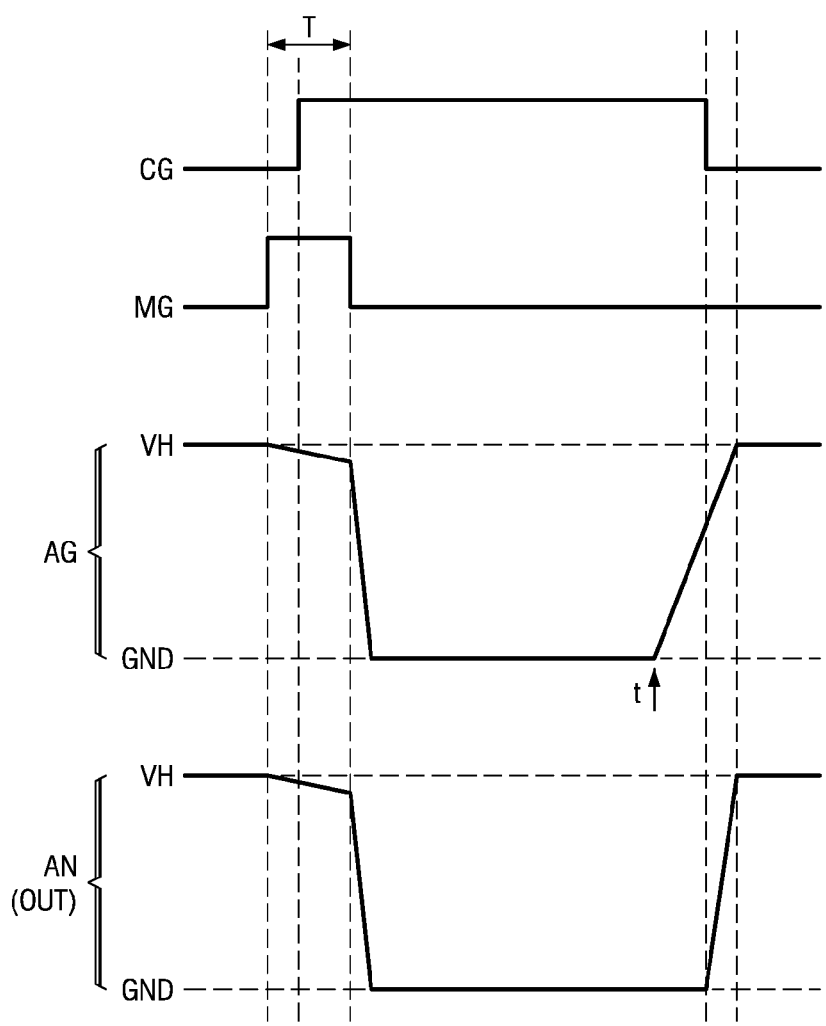
FIG. 4 is a timing chart showing the method for driving the thyristor in the semiconductor region of the first embodiment of the present invention.

FIG. 4 is a timing chart showing a method for operating said thyristor in said semiconductor device of this embodiment.

Electrical potential inputs to anode AN are controlled to outputs from node OUT by on and off signals to cathode gate CG.

In this example, as shown in FIG. 4, when said thyristor is switched from an OFF state to an ON state, it is operated so that the ON state potential is applied to gate electrode MG for a period long enough for switching the cathode gate CG from the OFF state to the ON state. When the thyristor is turned on by sending current into the cathode gate CG, the MOS transistor is first turned on by sending current into the MOS transistor gate electrode MG, so that a steep rise rate in current through the thyristor can be suppressed. As explained above, this is advantageous, because steeply rising currents can cause Electro Magnetic Interference (EMI), which causes undesirable electrical and radiative noise).

Also in this example, when the thyristor is switched from the ON state to the OFF state, the extraction of electrons of the first n-type semiconductor region 20 can be accelerated by turning on the MOS transistor for a fixed period, contributing to shortening of the switching time between the ON state and the OFF state.

Also in this example, an anode gate is installed in the thyristor of this embodiment, and when the thyristor is switched from an ON state to an OFF state, the anode gate AG is switched to a potential higher than or the same as that of the anode, in a time period shorter than the timing for switching the cathode gate from the ON state to the OFF.

With the addition of the anode gate AG, holes in the first n-type semiconductor region 20 injected during an ON state of the thyristor can be effectively extracted. When the thyristor is turned off, since holes in the first n-type semiconductor region 20 are easily extracted by setting the first n-type semiconductor region 20 at a potential higher than that of the anode AN by controlling the anode gate AG, the switching time to the OFF state time is shortened compared with a case where holes are extracted by lowering the cathode gate CG to ground or a negative potential. Also, even through an anode gate AG is added, the OFF state switching time can be shortened while maintaining the standoff voltage.

Also in this example, said thyristor in said semiconductor device of this embodiment has an architecture in which the thyristor is completely isolated by a bottom insulating film and a trench type isolation structure, so that the time required for hole extraction is reduced, thereby allowing shortening of the turn-off time of the thyristor.

Also in this example, in FIG. 4, the ON state potential of cathode gate CG and the ON state potential of the gate electrode MG are respectively about 0.8 V and about 5 V when potential VH is about 200 V when ground potential GND is used as off potential. The anode gate AG is controlled to an open circuit state for a period T and a period in which the ON state potential is applied to the cathode gate CG and is controlled to a potential higher than or the same as that of the anode AN by a circuit not shown in the Figure for a period in which the anode AN is returned to a potential VH from time t. Furthermore, the anode gate AG may be controlled in an open state or may also be connected to the anode AN for periods other than the above-mentioned period.

Figure 14:
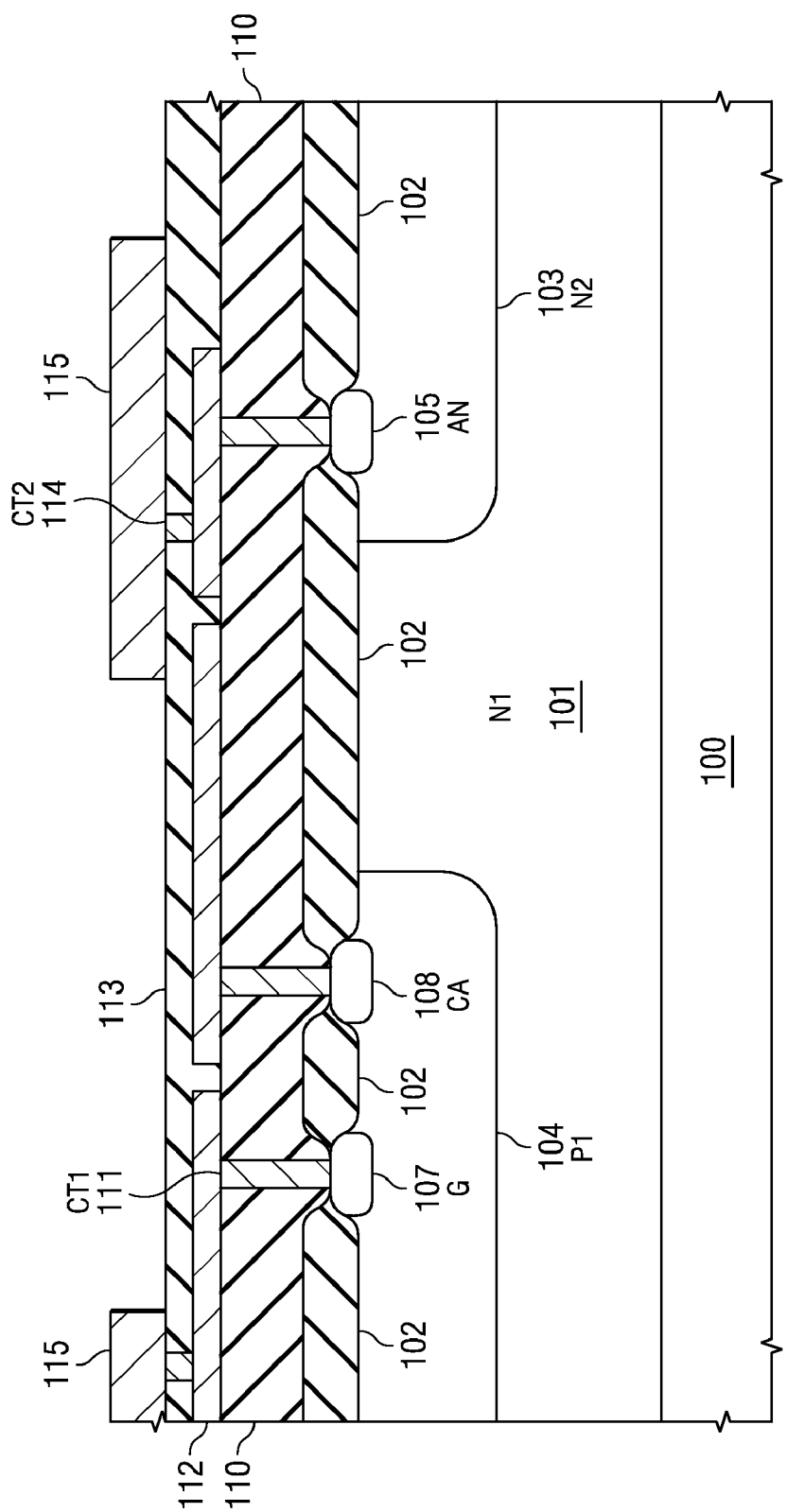
FIG. 14 is a plan view showing the semiconductor device having a thyristor of the fifth embodiment of the present invention.

A thyristor 1 of a first embodiment as shown in FIGS. 1 and 2 was prepared and adopted as a sample 1. Here, device size in sample 1 was set at 100 μm×100 μm. Also, a thyristor of a conventional example shown in FIG. 14 was prepared and adopted as a sample 2. Specifically, a structure in which the bottom insulating film and the trench shaped element separating insulating film were omitted from sample 1 and no anode gate was installed, and size, etc., were equivalent to those of sample 1.

The results of measurement of turn-off time showed turn-off time of sample 2 was about 1 μs, whereas turn-off time was about 200 ns in sample 1 and could be reduced to about ⅕ that value.

Figure 5:
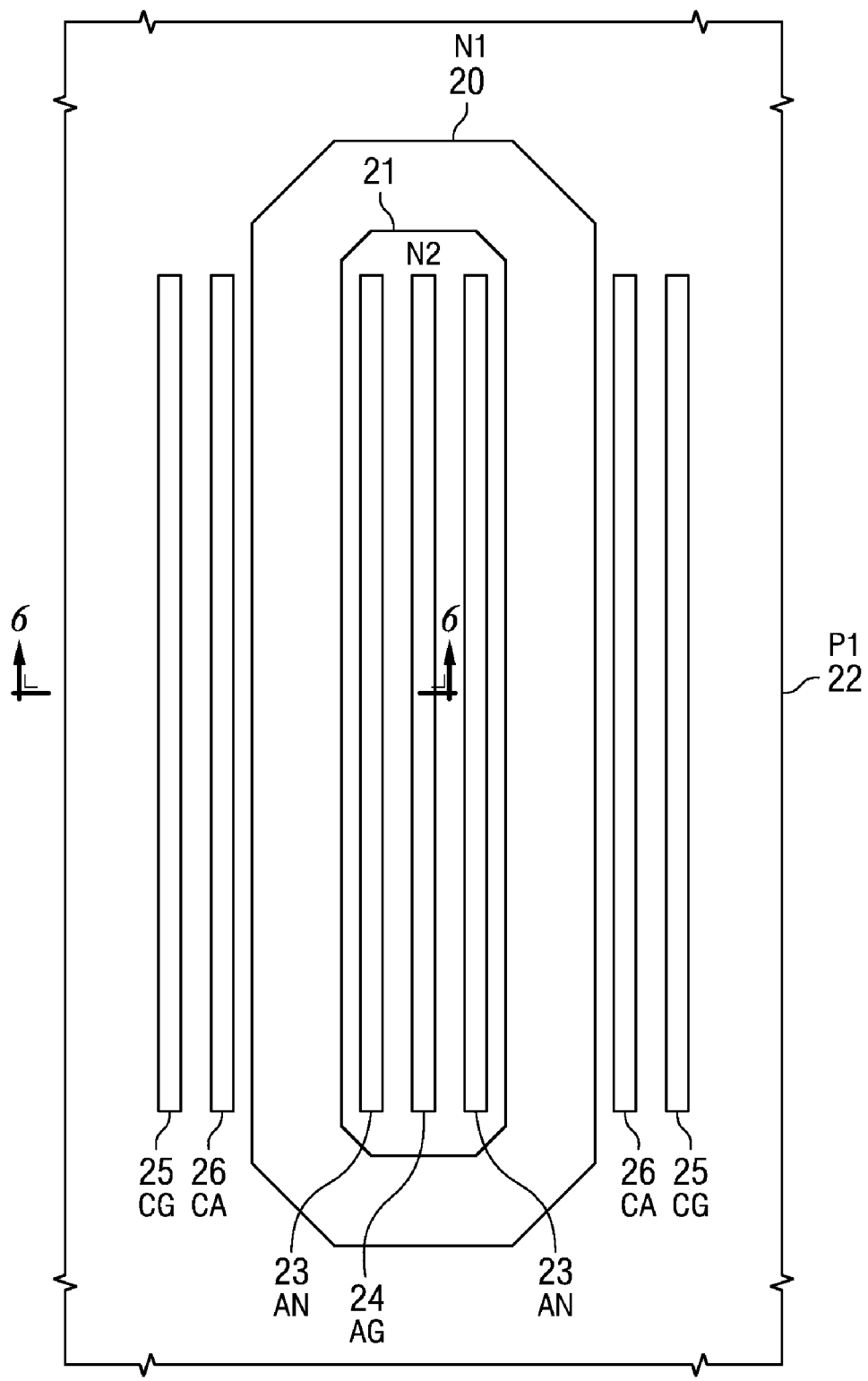
FIG. 5 is a plan view showing the semiconductor device having a thyristor of a second embodiment of the present invention.
Figure 6:
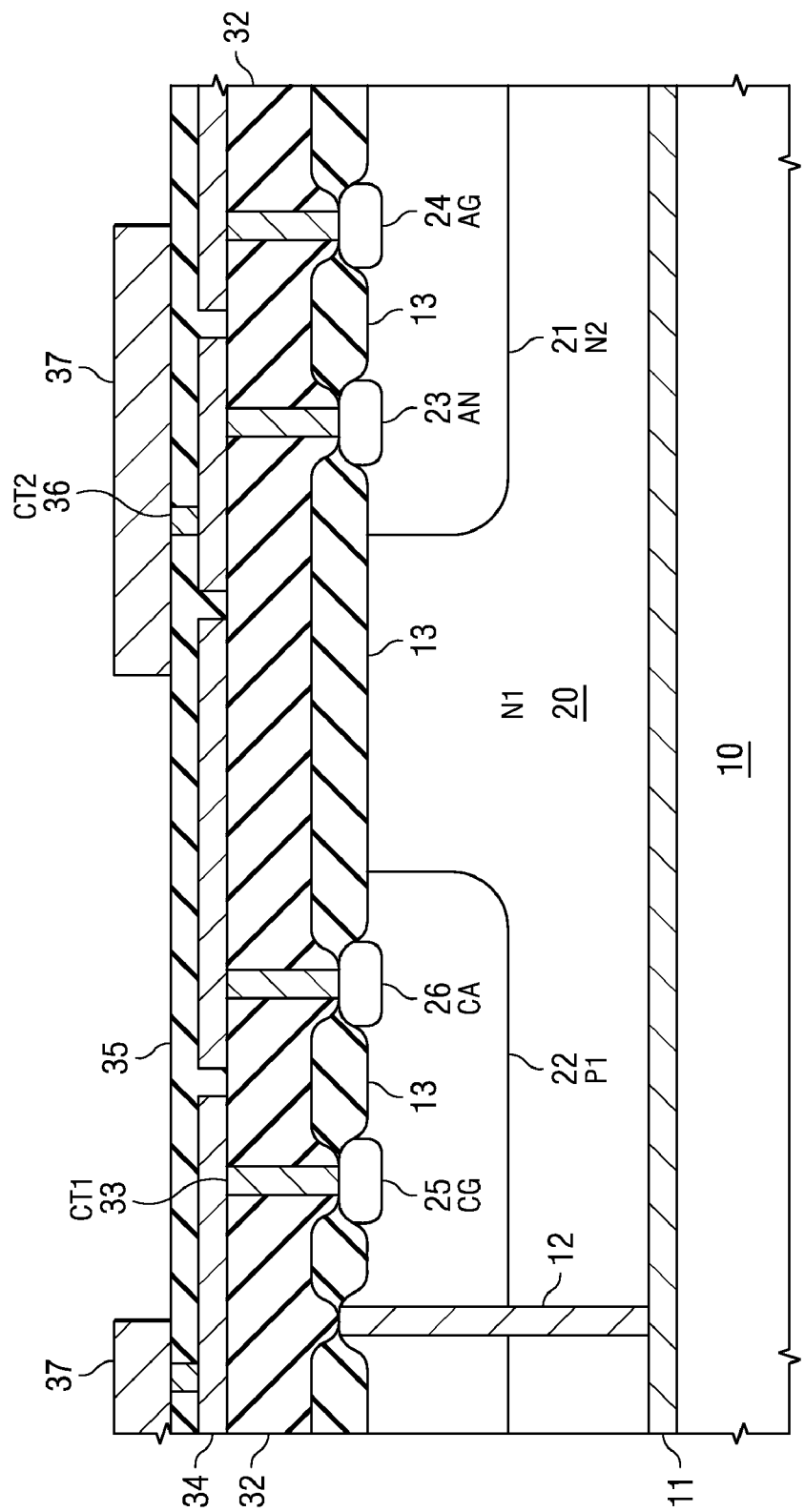
FIG. 6 is a cross section at 6-6 of FIG. 5.

FIG. 5 is a plan view showing a semiconductor device having a thyristor of this embodiment, and FIG. 6 is a cross section at 6-6 of FIG. 5.

An architecture is adopted in which said gate insulating film and said gate electrode in the thyristor of the first embodiment are omitted, and said isolation layer is formed by LOCOS.

Also in this example, in the thyristor of this embodiment, an anode gate is installed similarly to the first embodiment, and when the thyristor is switched from an ON state to an OFF state, the anode gate AG is switched to a potential higher than or the same as that of the anode, in a time period shorter than the timing for switching the cathode gate from the ON state to the OFF state.

The turn-off time of the thyristor can be shortened by operating the anode gate as mentioned above.

Also in this example, said thyristor in said semiconductor device of this embodiment has an architecture in which the thyristor is completely isolated by a bottom insulating film and a trench type isolation structure, so that the time required for hole extraction is reduced, thereby allowing shortening of the turn-off time of the thyristor.

Figure 7:
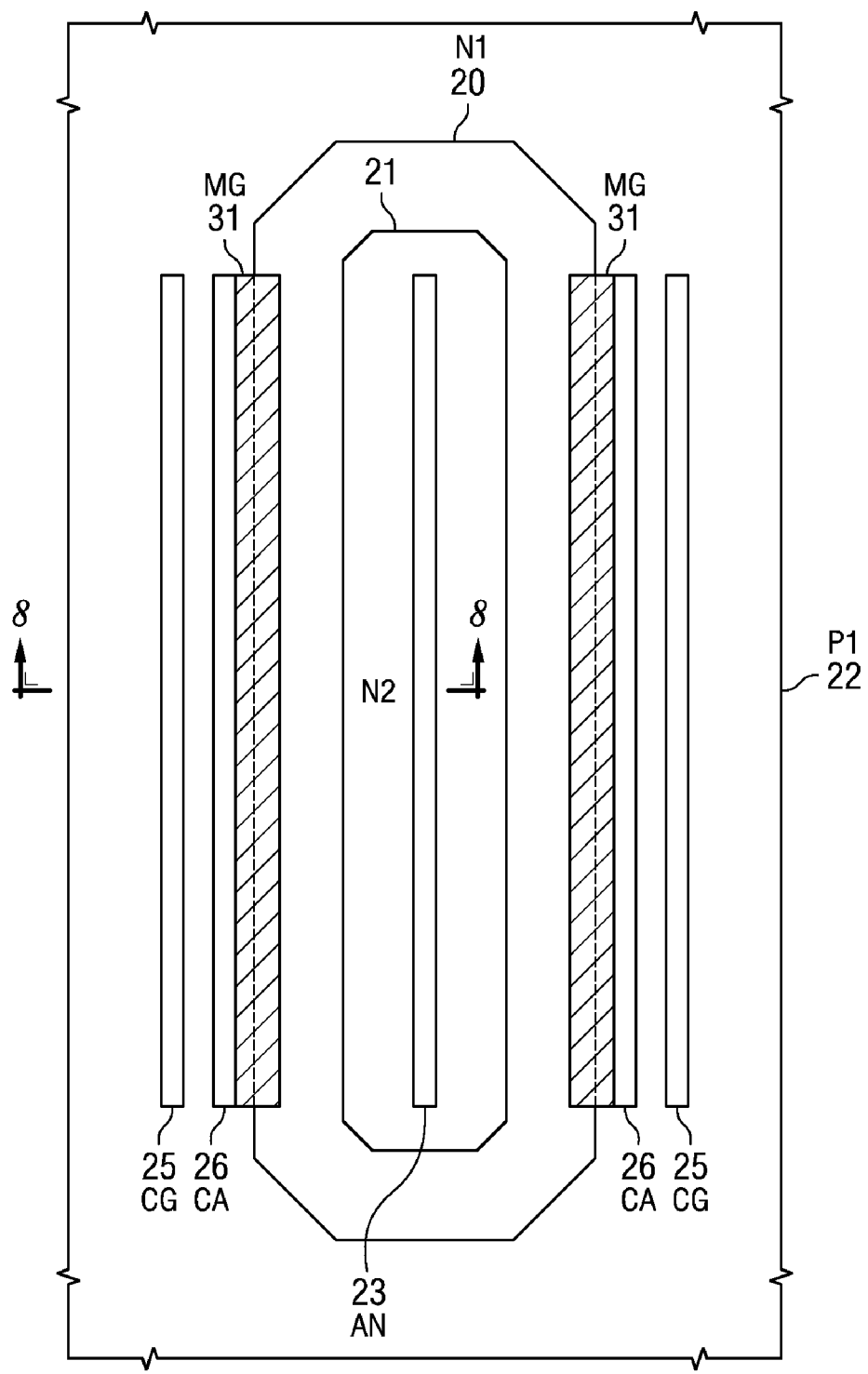
FIG. 7 is a plan view showing the semiconductor device having a thyristor of a third embodiment of the present invention.
Figure 8:
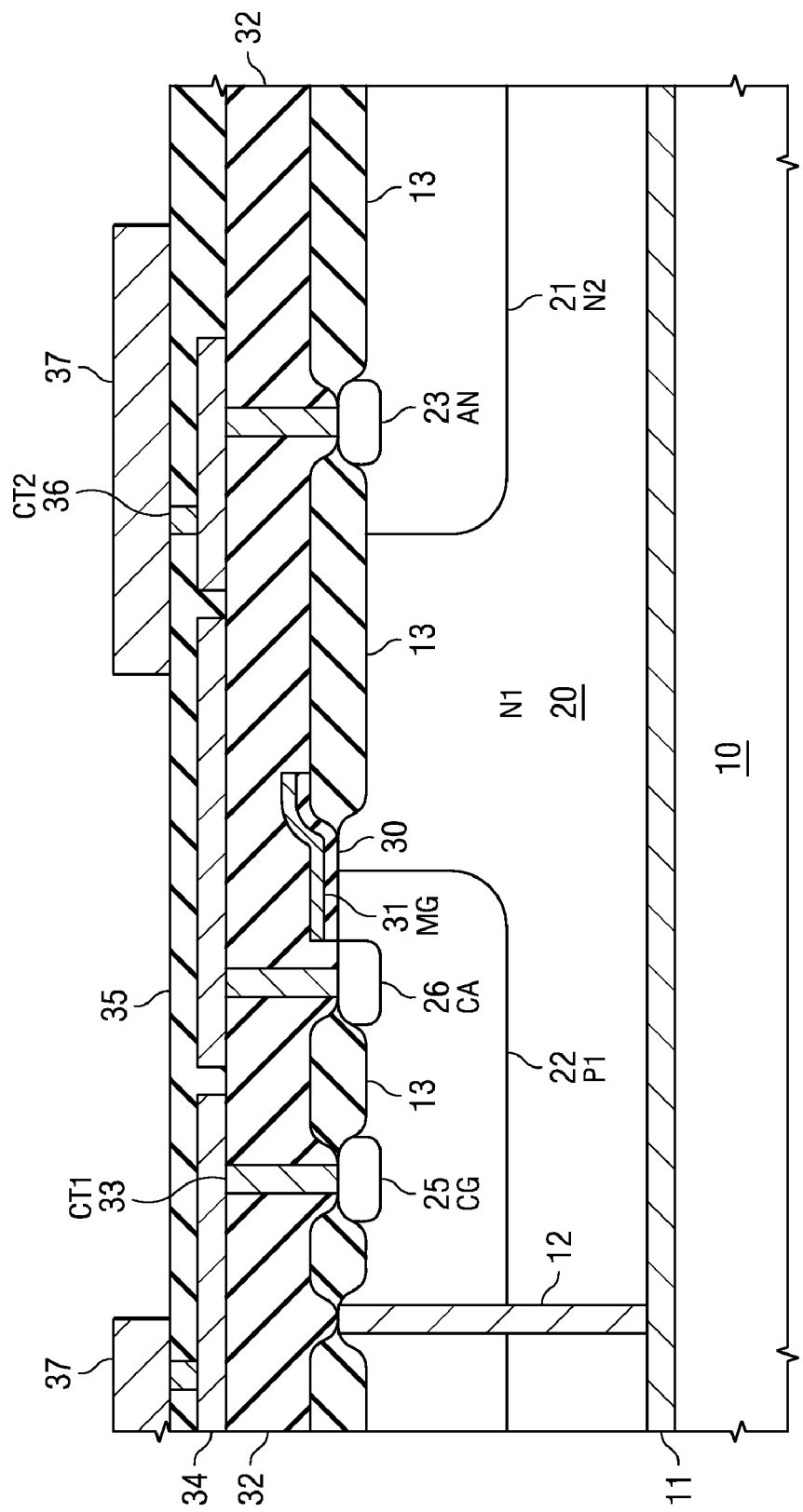
FIG. 8 is a cross section 8-8 of FIG. 7.

FIG. 7 is a plan view showing a semiconductor device having a thyristor of this embodiment, and FIG. 8 is a cross section at 8-8 of FIG. 7.

An architecture is adopted in which the anode gate in the first embodiment is not installed.

Specifically, in this example, a bottom insulating film 11, typically composed of silicon dioxide, is formed on a p-type semiconductor substrate 10, and a first n-type semiconductor region (first semiconductor region) 20 (N1), typically composed of silicon, is formed on an upper surface of the bottom insulating film 11.

Continuing in this example, a trench type isolation structure 12 for separating components is formed through the first n-type semiconductor region 20 and an isolation layer 13, typically formed by local oxidation of silicon (LOCOS), is formed on a surface layer part of the first n-type semiconductor region 20, so that elements are separated. The isolation layer and structures (13, 12) are typically composed of silicon dioxide.

Continuing in this example, a second n-type semiconductor region (sixth semiconductor region) 21 (N2) with an impurity concentration different from that of the first n-type semiconductor region 20 is formed at a prescribed depth in a prescribed region of the first n-type semiconductor region 20, and a first p-type semiconductor region (second semiconductor region) 22 (P1) is formed in a region different from the second n-type semiconductor region 21.

Continuing in this example, a second p-type semiconductor region (third semiconductor region) 23, designated as an anode AN, is formed in a region separated by the element separating insulating film 13 on the surface layer part of the second n-type semiconductor region 21.

Continuing in this example, in a region separated by the isolating layer 13 on a surface region of first p-type semiconductor region 22, a third p-type semiconductor region (fifth semiconductor region) 25, designated as a cathode gate CG, and a third n-type semiconductor region (fourth semiconductor region) 26, designated as a cathode CA, are formed.

As mentioned above, a thyristor is formed comprising second p-type semiconductor region 23, first n-type semiconductor region 20 and second n-type semiconductor region 21, and first p-type semiconductor region 22 and third n-type semiconductor region 26.

Also, the third p-type semiconductor region 25 is connected to the first p-type semiconductor region 22.

Continuing in this example, a gate insulating film 30 and a gate electrode 31 (MG) are formed in an upper layer of the first p-type semiconductor region 22 in a region at least from a boundary of the first n-type semiconductor region 20 and the first p-type semiconductor region 22 to a boundary of the first p-type semiconductor region 22 and the third n-type semiconductor region 26, so that a MOS transistor is formed.

The architecture of the above-mentioned upper layer is substantially similar to that of the first embodiment.

In the thyristor of this embodiment, similarly to the thyristor in the first embodiment, when said thyristor is switched from an OFF state to an ON state, it is operated so that the ON state potential is applied to gate electrode MG for a period long enough for switching the cathode gate CG from the OFF state to the ON state. As discussed above, when the thyristor is operated in this manner, a steep rise rate in current through the thyristor can be suppressed.

Also in this example, said thyristor in said semiconductor device of this embodiment has an architecture in which the thyristor is completely isolated by a bottom insulating film and a trench type isolation structure, so that the time required for hole extraction is reduced, thereby allowing shortening of the turn-off time of the thyristor.

Figure 9:
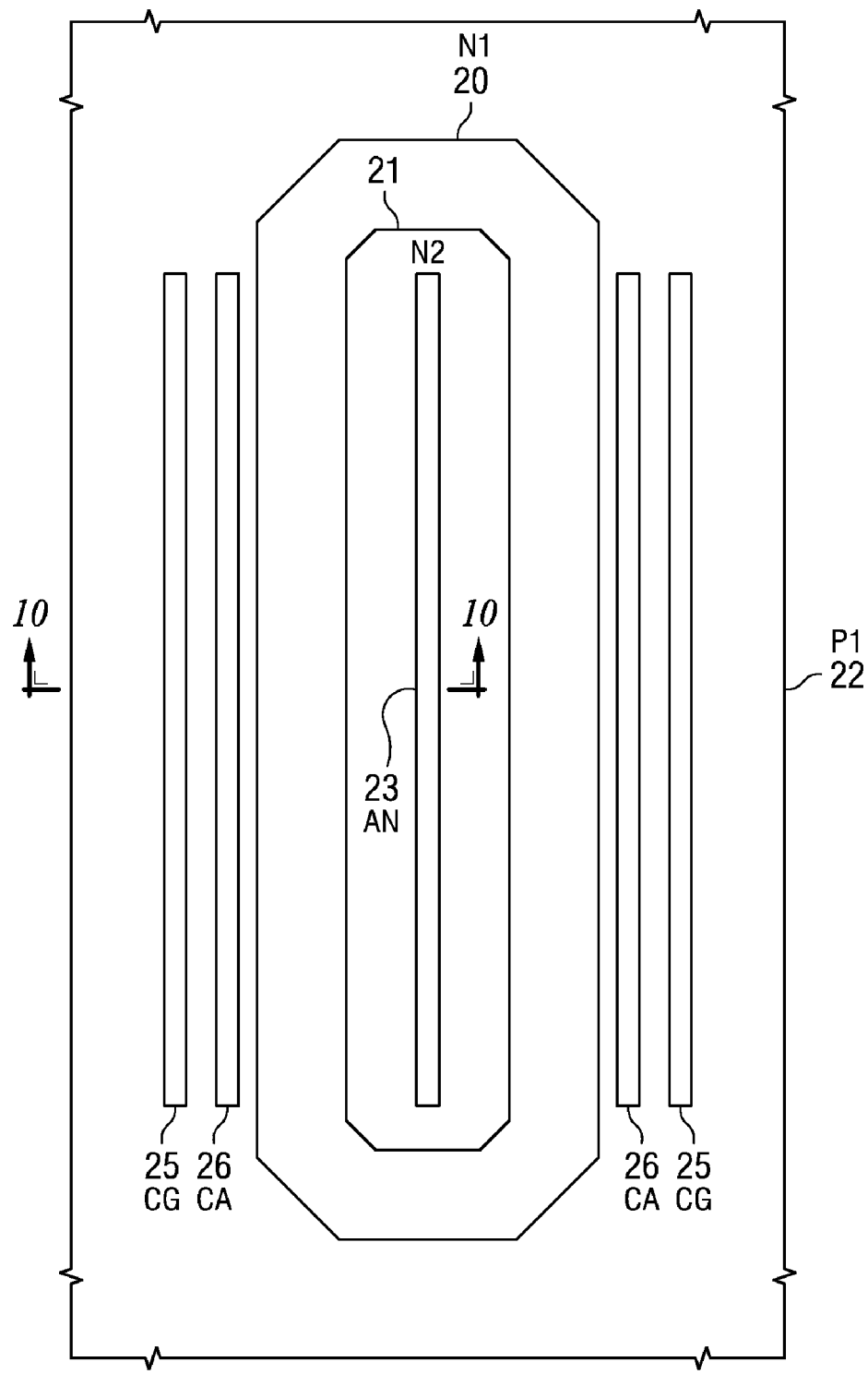
FIG. 9 is a plan view showing the semiconductor device having a thyristor of a third embodiment of the present invention.

FIG. 9 is a plan view showing the semiconductor device having a thyristor of this embodiment, and FIG. 10 is a cross section at 10-10 of FIG. 9.

An architecture is adopted in which, in this embodiment, said gate insulating film and said gate electrode in the thyristor of the first embodiment are omitted, and said isolation layer is formed by LOCOS.

Also in this example, said thyristor in said semiconductor device of this embodiment has an architecture in which the thyristor is completely isolated by a bottom insulating film and a trench type isolation structure, so that the time required for hole extraction is reduced, thereby allowing shortening of the turn-off time of the thyristor.

Figure 11:
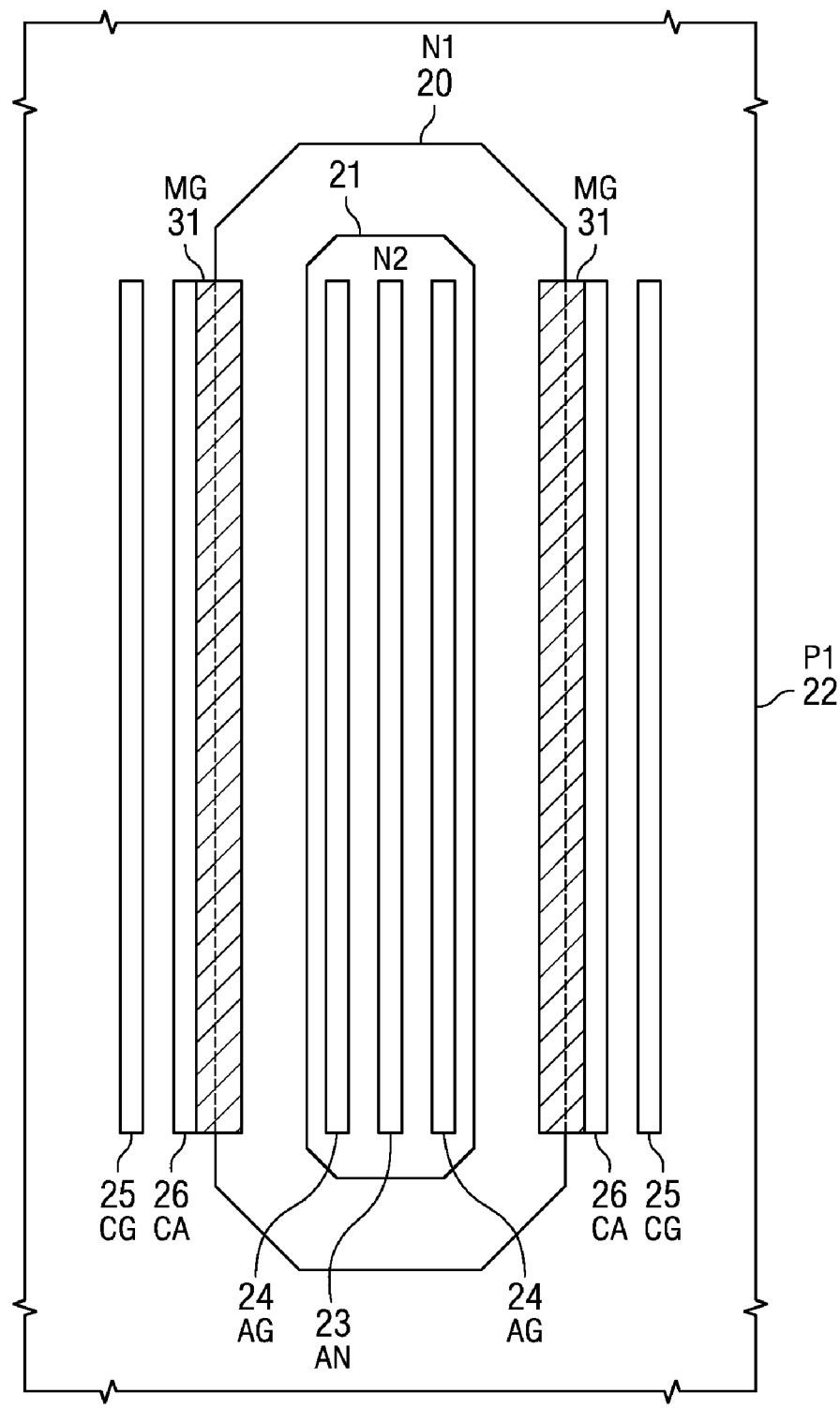
FIG. 11 is a plan view showing the semiconductor device having a thyristor of the fifth embodiment of the present invention.
Figure 12:
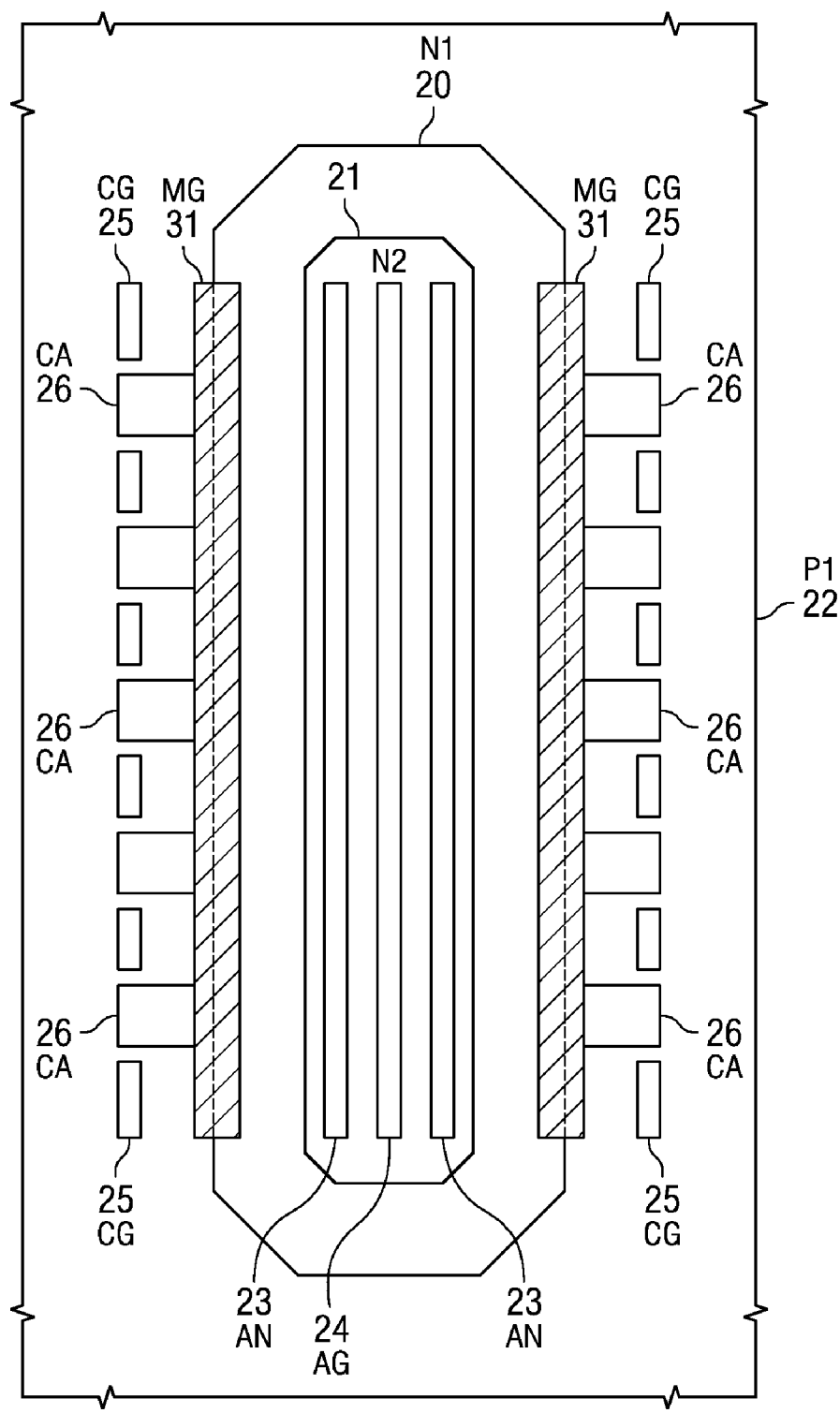
FIG. 12 is a plan view showing the semiconductor device having a thyristor of the fifth embodiment of the present invention.
Figure 13:
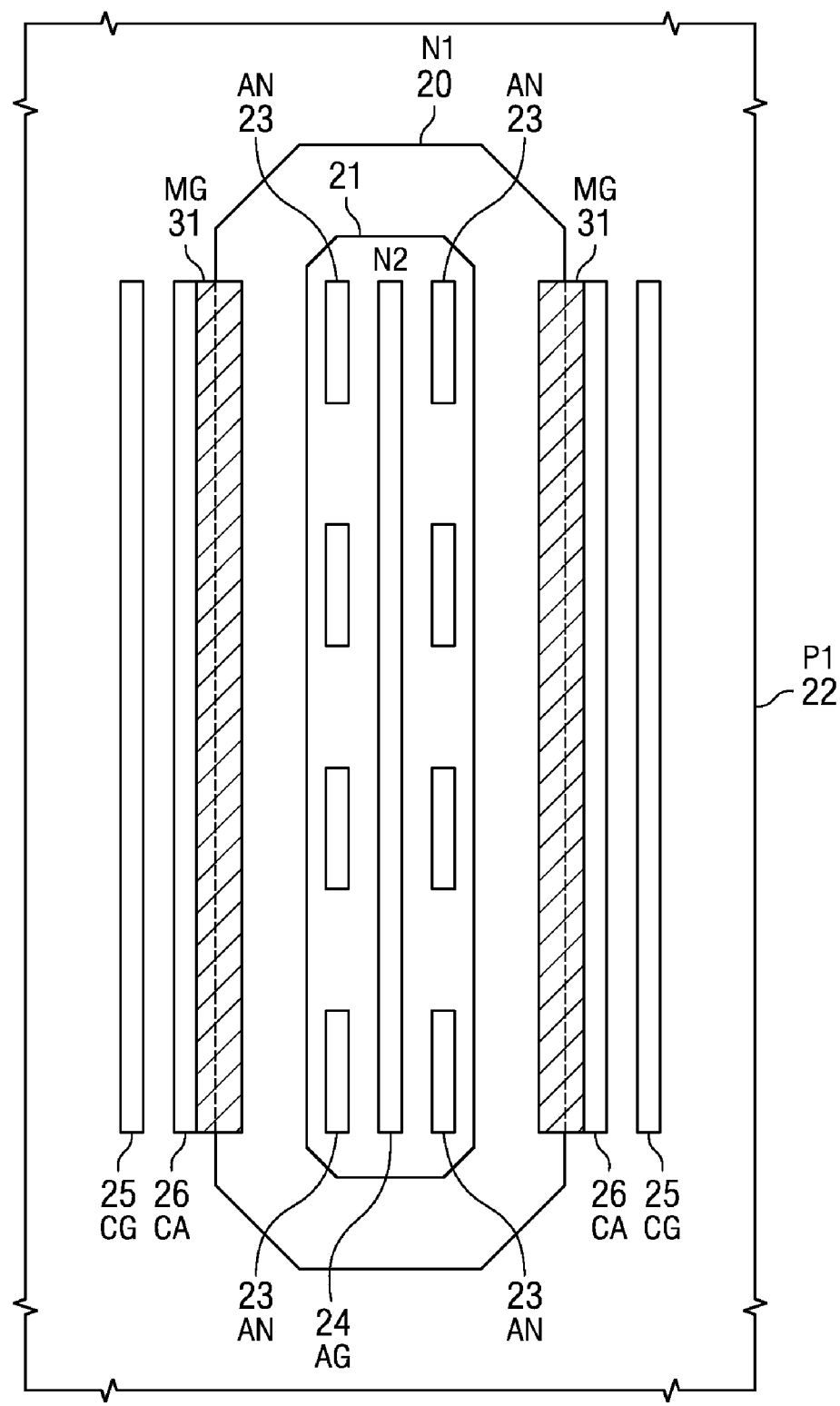
FIG. 13 is a plan view showing the semiconductor device having a thyristor of the fifth embodiment of the present invention.

FIGS. 11-13 are plan views showing semiconductor devices having thyristors of this invention and correspond to modified configurations of the first embodiment.

FIG. 11 shows a configuration in which the relative locations of said anode AN and said anode gate AG are exchanged, compared to the thyristor in the first embodiment, depicted in FIG. 1.

FIG. 12 shows a configuration in which a cathode CA and a cathode gate CG are arranged in an alternating order on a straight line. A gate insulating film and a gate electrode MG constituting a MOS transistor are installed at a position adjacent to the cathode CA.

FIG. 13 shows a configuration in which the anode AN is divided into a plurality of segments and the anode between segments is removed.

In the embodiments depicted in FIG. 11 through FIG. 13, an effect similar to that of the first embodiment can be attained. Specifically, in this example, when said thyristor is switched from an OFF state to an ON state, it is operated so that the ON state potential is applied to gate electrode MG for a period long enough for switching the cathode gate CG from the OFF state to the ON state. As discussed above, when the thyristor is operated in this manner, a steep rise rate in current through the thyristor can be suppressed.

Also, when the thyristor is switched from an ON state to an OFF state, the anode gate AG is switched to a potential higher than or the same as that of the anode, in a time period shorter than the timing for switching the cathode gate from the ON state to the OFF. Also in these embodiments, the thyristor has an architecture in which the thyristor is completely isolated by a bottom insulating film and a trench type isolation structure, so that the time required for hole extraction is reduced, thereby allowing shortening of the turn-off time of the thyristor.

The present invention is not limited to the above-mentioned explanations of operation.

For example, in the above-mentioned embodiments, the thyristor is left and right symmetric around the anode gate as shown in each plan view; however, a thyristor with a configuration that is not symmetric may also be embodied by this invention.

Also, in the above-mentioned embodiments, the second p-type semiconductor region 23 and the third n-type semiconductor region 24 are formed in the second n-type semiconductor region 21; however an architecture in which the second n-type semiconductor region 21 is not formed and the second p-type semiconductor region 23 and the third n-type semiconductor region 24 are formed in the first n-type semiconductor region 20 may also be embodied by this invention.

In addition, the above embodiments can be variously modified in a manner whereby the essence of the present invention is preserved.

The semiconductor device of the present invention can be applied as a device constituting a half bridge circuit in a power supply, and other applications.

What is claimed is:

1. An integrated circuit including a thyristor comprising:
   an n-type semiconductor region of an n-type impurity concentration formed in or on a substrate, the n-type semiconductor region having an upper surface and a lower surface;
   an isolation layer formed at the upper surface of the n type semiconductor region;
   an n-type well region formed spaced above the lower surface in the n-type semiconductor region, the n-type well region having an n-type impurity concentration higher than the n-type impurity concentration of the n-type semiconductor region;
   a p-type well region formed spaced above the lower surface in the n-type semiconductor region at a position laterally spaced from the n-type well region across a part of the n-type semiconductor region, the p-type well region having a p-type impurity concentration;
   a first p-type contact region formed at the upper surface in the n type well region, the first p-type contact region defining an anode;
   a first n-type contact region formed at the upper surface in the n-type well region at a position laterally spaced from the first p-type contact region in a direction away from the p-type well region, the first n-type contact region having an n-type impurity concentration higher than the n-type impurity concentration of the n-type well region and defining an anode gate; the first n-type contact region being separated by isolation material of the isolation layer from the first p-type contact region;
   a second p-type contact region formed at the upper surface in the p-type well region, the second p-type contact region having a p-type impurity concentration higher than the p-type impurity concentration of the p-type well region, and defining a cathode gate;
   a second n-type contact region formed at the upper surface in the p-type well region at a position laterally spaced from the second p-type contact region in a direction towards the n-type well region and defining a cathode; the second n-type contact region being separated by isolation material of the isolation layer from the second p-type contact region and from the n-type well region;
   whereby a thyristor is formed comprising the first p-type contact region defining the anode, the n-type well region, the n-type semiconductor region, the p-type well region and the second n-type contact region defining the cathode.

2. The circuit of claim 1, wherein the substrate comprises a p-type semiconductor substrate, the circuit further comprises a bottom insulating film formed over the p-type semiconductor substrate, and the n-type semiconductor region is formed over the bottom insulating film.

3. The circuit of claim 2, further comprising a trench isolation structure formed vertically from the upper surface through the p-type well region and through the n-type semiconductor region down to the bottom insulating film at a location laterally spaced from the second p-type contact region in a direction away from the n-type well region.

4. The circuit of claim 1, further comprising a gate electrode formed over a gate insulating film at the upper surface over the p-type well region from a boundary of the second n-type contact region closest to the n-type well region at least to a boundary of the p-type well region closest to the n-type well region.

5. The circuit of claim 4, wherein the gate electrode over the gate insulating film extends from the boundary of the second n-type contact region closest to the n-type well region in a direction towards the n-type well region, to a first lateral distance beyond the boundary of the p-type well region closest to the n-type well region.

6. The circuit of claim 5, wherein the gate electrode extends beyond the first lateral distance to a second lateral distance over a portion of the insulating material separating the second n-type contact region from the n-type well region.

7. The circuit of claim 6, wherein the substrate comprises a p-type semiconductor substrate, the circuit further comprises a bottom insulating film formed over the p-type semiconductor substrate, and the n-type semiconductor region is formed over the bottom insulating film.

8. The circuit of claim 7, further comprising a trench isolation structure formed vertically from the upper surface through the p-type well region and through the n-type semiconductor region down to the bottom insulating film at a location laterally spaced from the second p-type contact region in a direction away from the n-type well region.

9. The circuit of claim 4, wherein the substrate comprises a p-type semiconductor substrate, the circuit further comprises a bottom insulating film formed over the p-type semiconductor substrate, and the n-type semiconductor region is formed over the bottom insulating film.

10. The circuit of claim 9, further comprising a trench isolation structure formed vertically from the upper surface through the p-type well region and through the n-type semiconductor region down to the bottom insulating film at a location laterally spaced from the second p-type contact region in a direction away from the n-type well region.

11. An integrated circuit including a thyrister comprising:
a first conductivity-type semiconductor region of a first conductivity-type impurity concentration formed in or on a substrate, the first conductivity-type semiconductor region having an upper surface and a lower surface;
an isolation layer formed at the upper surface of the first conductivity-type semiconductor region;
a first conductivity-type well region formed spaced above the lower surface in the first conductivity-type semiconductor region, the first conductivity-type well region having first conductivity-type impurity concentration higher than the first conductivity-type impurity concentration of the first conductivity-type semiconductor region;
a second conductivity-type well region formed spaced above the lower surface in the first conductivity-type well region at a position laterally spaced from the second first conductivity-type well region across a part of the first conductivity-type semiconductor region, the second conductivity-type well region having a second conductivity-type impurity concentration;
a first second conductivity-type contact region formed at the upper surface in the first conductivity-type well region, the first second conductivity-type contact region defining one of an anode or a cathode;
a first first conductivity-type contact region formed at the upper surface in the first conductivity-type well region at a position laterally spaced from the first second conductivity-type contact region in a direction away from the second conductivity-type well region, the first first conductivity-type contact region having a first conductivity-type impurity concentration higher than the first conductivity-type impurity concentration of the first conductivity-type well region and defining one of an anode gate or a cathode gate; the first first conductivity-type contact region being separated by isolation material of the isolation layer from the first second conductivity-type contact region;
a second second conductivity-type contact region formed at the upper surface in the second conductivity-type well region, the second second conductivity-type contact region having a second conductivity-type impurity concentration higher than the second conductivity-type impurity concentration of the second conductivity-type well region, and defining the other of an anode gate or a cathode gate;
a second first conductivity-type contact region formed at the upper surface in the second conductivity-type well region at a position laterally spaced from the second second conductivity-type contact region in a direction towards the first conductivity-type well region and defining the other of an anode or a cathode; the second first conductivity-type contact region being separated by isolation material of the isolation layer from the second second conductivity-type contact region and from the second conductivity-type well region;
whereby a thyrister is formed comprising the first second conductivity-type contact region defining the one of the anode or the cathode, the first conductivity-type well region, the first conductivity-type semiconductor region, the second conductivity-type well region and the second first conductivity-type contact region defining the other of the anode or the cathode.

12. The circuit of claim 11, wherein the substrate comprises a second conductivity-type semiconductor substrate, the circuit further comprises a bottom insulating film formed over the second conductivity-type semiconductor substrate, and the first conductivity-type semiconductor region is formed over the bottom insulating film.

13. The circuit of claim 12, further comprising a trench isolation structure formed vertically from the upper surface through the second conductivity-type well region and through the first conductivity-type semiconductor region down to the bottom insulating film at a location laterally spaced from the second conductivity-type contact region in a direction away from the first conductivity-type well region.

14. The circuit of claim 11, further comprising a gate electrode formed over a gate insulating film at the upper surface over the second conductivity-type well region from a boundary of the second first conductivity-type contact region closest to the first conductivity-type well region at least to a boundary of the second conductivity-type well region closest to the first conductivity-type well region.

15. The circuit of claim 14, wherein the gate electrode over the gate insulating film extends from the boundary of the second second conductivity-type contact region closest to the second conductivity-type well region in a direction towards the first conductivity-type well region to a first lateral distance beyond the boundary of the first second conductivity-type well region closest to the first conductivity-type well region.

16. The circuit of claim 15, wherein the gate electrode extends beyond the first lateral distance to a second lateral distance over a portion of the insulating material separating the second first conductivity-type contact region from the first conductivity-type well region.

17. The circuit of claim 16, wherein the substrate comprises a second conductivity-type semiconductor substrate, the circuit further comprises a bottom insulating film formed over the second conductivity-type semiconductor substrate, and the first conductivity-type semiconductor region is formed over the bottom insulating film.

18. The circuit of claim 17, further comprising a trench isolation structure formed vertically from the upper surface through the second conductivity-type well region and through the first conductivity-type semiconductor region down to the bottom insulating film at a location laterally spaced from the second second conductivity-type contact region in a direction away from the first conductivity-type well region.

19. The circuit of claim 14, wherein the substrate comprises a second conductivity-type semiconductor substrate, the circuit further comprises a bottom insulating film formed over the second conductivity-type semiconductor substrate, and the first conductivity-type semiconductor region is formed over the bottom insulating film.

20. The circuit of claim 19, further comprising a trench isolation structure formed vertically from the upper surface through the second conductivity-type well region and through the first first conductivity-type semiconductor region down to the bottom insulating film at a location laterally spaced from the second second conductivity-type contact region in a direction away from the first conductivity-type well region.

* * * * *